(12) United States Patent
Su et al.

(10) Patent No.: US 10,943,874 B1
(45) Date of Patent: Mar. 9, 2021

(54) APPARATUS, SYSTEM, AND METHOD FOR MITIGATING WARPAGE OF INTEGRATED CIRCUITS DURING REFLOW PROCESSES

(71) Applicant: Juniper Networks, Inc., Sunnyvale, CA (US)

(72) Inventors: Peng Su, Sunnyvale, CA (US); Valery Kugel, Sunnvale, CA (US); Jimmy Chun-Chuen Leung, Sunnyvale, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 16/555,773

(22) Filed: Aug. 29, 2019

(51) Int. Cl.
| | |
|---|---|
| H01L 23/00 | (2006.01) |
| H01L 23/10 | (2006.01) |
| H01L 23/16 | (2006.01) |
| H01L 21/50 | (2006.01) |

(52) U.S. Cl.
CPC .......... *H01L 23/562* (2013.01); *H01L 21/50* (2013.01); *H01L 23/10* (2013.01); *H01L 23/16* (2013.01); *H01L 2924/3511* (2013.01)

(58) Field of Classification Search
CPC ....... H01L 23/562; H01L 23/16; H01L 23/50; H01L 23/10; H01L 2924/3511
See application file for complete search history.

(56) References Cited

U.S. PATENT DOCUMENTS

| | | | | |
|---|---|---|---|---|
| 5,900,312 A | * | 5/1999 | Sylvester | H01L 23/055 174/255 |
| 6,724,080 B1 | * | 4/2004 | Ooi | H01L 23/36 257/704 |
| 6,816,385 B1 | * | 11/2004 | Alcoe | H01L 23/4985 361/767 |
| 7,538,421 B2 | * | 5/2009 | Chen | H01L 23/16 257/704 |
| 8,986,806 B1 | * | 3/2015 | Baloglu | H05K 1/0271 428/81 |
| 2003/0047807 A1 | * | 3/2003 | Alcoe | H05K 1/0271 257/734 |
| 2006/0220224 A1 | * | 10/2006 | Cheng | H01L 25/105 257/706 |
| 2006/0226538 A1 | * | 10/2006 | Kawata | H01L 24/13 257/701 |
| 2008/0042263 A1 | * | 2/2008 | Wang | H01L 23/16 257/712 |
| 2008/0308305 A1 | * | 12/2008 | Kawabe | H05K 1/0271 174/255 |
| 2014/0061893 A1 | * | 3/2014 | Saeidi | H01L 21/52 257/712 |
| 2014/0167243 A1 | * | 6/2014 | Shen | H01L 23/4334 257/692 |

(Continued)

*Primary Examiner* — Errol V Fernandes
*Assistant Examiner* — Jeremy J Joy
(74) *Attorney, Agent, or Firm* — FisherBroyles, LLP (57) ABSTRACT

The stiffening brace may include a set of borders dimensioned to substantially surround an integrated circuit, wherein each border includes (1) a portion of material that is positioned atop a perimeter of the integrated circuit and (2) an additional portion of material that extends beyond the perimeter of the integrated circuit such that the additional portion of material overhangs a circuit board to which the integrated circuit is soldered. Various other apparatuses, systems, and methods are also disclosed.

12 Claims, 6 Drawing Sheets

(56) References Cited

U.S. PATENT DOCUMENTS

2016/0254220 A1* 9/2016 Lin .................... H05K 1/0271
257/668
2018/0233459 A1* 8/2018 Fushimi ................ H01L 23/32
2019/0221529 A1* 7/2019 Yong .................... H01L 23/552

* cited by examiner

APPARATUS, SYSTEM, AND METHOD FOR MITIGATING WARPAGE OF INTEGRATED CIRCUITS DURING REFLOW PROCESSES

BACKGROUND

Electronic components (such as integrated circuits) are often soldered to circuit boards by way of a process known as reflow soldering. For example, prior to initiating a reflow process, solder paste may be disposed on contact pads located on a circuit board, and then electronic components may be placed on top of the solder paste, which holds the electronic components in position atop their corresponding contact pads. After the electronic components have been put in place, the circuit board may undergo a reflow process that heats the solder paste to a certain temperature. The temperature must be hot enough to melt the solder paste such that, once cooled off, the solder forms permanent connection joints between the electronic components and their corresponding contact pads.

Unfortunately, electronic components with large package sizes, especially those of lidless construction, may pose and/or represent a significant challenge during the soldering process. For example, a reflow process may apply so much heat to a lidless integrated circuit that the package of the lidless integrated circuit warps. This warpage may bend the package such that permanent connection joints are unable to form between the connection terminals on the integrated circuit and the corresponding contact pads on the circuit board. As a result, the integrated circuit may fail to achieve full connectivity with the remaining electronic components laid out on the circuit board. Without full connectivity, the circuit board may fail to work as intended, leaving the computing device in which the circuit board is installed inoperable for its intended purpose.

The instant disclosure, therefore, identifies and addresses a need for apparatuses, systems, and methods for mitigating warpage of integrated circuits during reflow processes.

SUMMARY

As will be described in greater detail below, the instant disclosure generally relates to apparatuses, systems, and methods for mitigating warpage of integrated circuits during reflow processes. In one example, a stiffening brace for accomplishing such a task may include a set of borders dimensioned to substantially surround an integrated circuit, wherein each border includes (1) a portion of material that is positioned atop a perimeter of the integrated circuit and (2) an additional portion of material that extends beyond the perimeter of the integrated circuit such that the additional portion of material overhangs a circuit board to which the integrated circuit is soldered.

Similarly, a system for accomplishing such a task may include (1) an integrated circuit and (2) a stiffening brace comprising a set of borders dimensioned to substantially surround the integrated circuit, wherein each border includes (A) a portion of material that is positioned atop a perimeter of the integrated circuit and (B) an additional portion of material that extends beyond the perimeter of the integrated circuit such that the additional portion of material overhangs a circuit board to which the integrated circuit is soldered.

A corresponding method may involve (1) forming a stiffening brace that includes a set of borders dimensioned to substantially surround a die secured to a substrate of an integrated circuit and (2) coupling the stiffening brace to the substrate of the integrated circuit such that each border includes (A) a portion of material that is positioned atop a perimeter of the substrate of the integrated circuit and (B) an additional portion of material that extends beyond the perimeter of the integrated circuit such that the additional portion of material overhangs a circuit board to which the integrated circuit is soldered.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for mitigating warpage of integrated circuits during reflow processes. As will be explained in greater detail below, embodiments of the instant disclosure may involve forming a stiffening brace that includes a set of borders dimensioned to substantially surround a die secured to a substrate of an integrated circuit. These embodiments may then involve coupling the stiffening brace to the substrate of the integrated circuit such that each border of the stiffening brace includes a portion of material that is positioned atop the perimeter of the substrate of the integrated circuit and an additional portion of material that extends beyond the perimeter of the integrated circuit. In these embodiments, the additional portion of material included in the stiffening brace may overhang the circuit board to which the integrated circuit is soldered.

In these embodiments, the additional portion of material included in the stiffening brace may provide additional strength and/or structural support to the integrated circuit during the reflow process. As a result, these embodiments may be able to impede and/or prevent the substrate of the integrated circuit from warping during the reflow process even though the reflow process reaches a temperature that would have otherwise caused warpage had the additional portion of material not been incorporated into the stiffening brace.

The following will provide, with reference to FIGS. 1-5, examples of apparatuses and/or corresponding components and implementations that facilitate mitigating warpage of integrated circuits during reflow processes. In addition, the following will provide, with reference to FIG. 6, examples of methods for mitigating warpage of integrated circuits during reflow processes.

Figure 1:
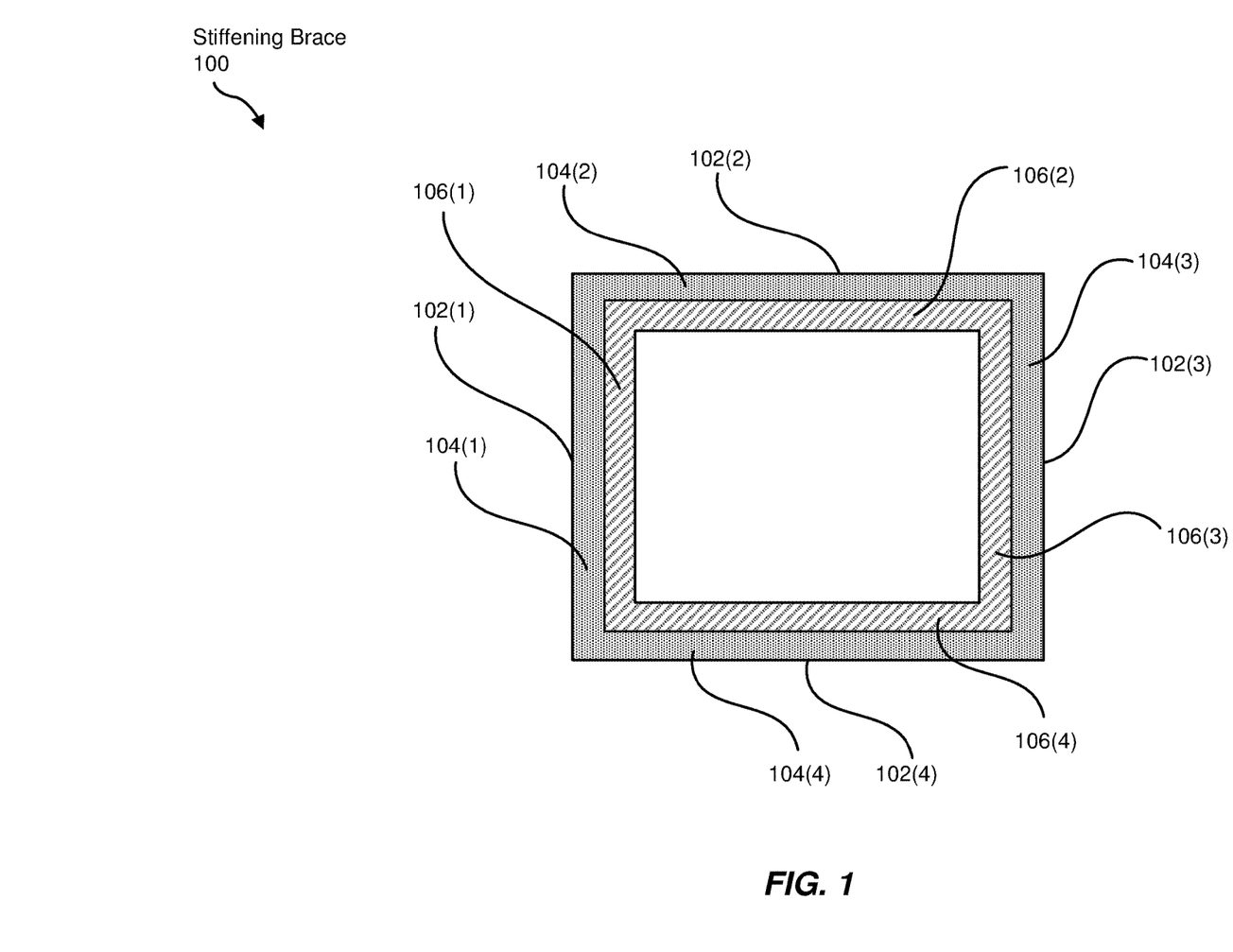
FIG. 1 is a block diagram of an exemplary stiffening brace for mitigating warpage of integrated circuits during reflow processes.

FIG. 1 shows an exemplary stiffening brace 100 for mitigating warpage of integrated circuits during reflow processes. As illustrated in FIG. 1, stiffening brace 100 may include and/or represent any type or form of physical material, structure, and/or support feature that fastens, couples, and/or adheres to an integrated circuit. In one example, stiffening brace 100 may include and/or represent a ring that is fixed to the top surface and/or side surface of a lidless integrated circuit. In this example, the top surface of the lidless integrated circuit may include and/or represent the top surface of the substrate of the lidless integrated circuit. Additionally or alternatively, the side surface of the lidless integrated circuit may include and/or represent the side surface of the substrate of the lidless integrated circuit. Stiffening brace 100 may at least partially surround a die of the lidless integrated circuit.

Stiffening brace 100 may include and/or form any suitable shape. In some examples, stiffening brace 100 may form a square, a circle, and/or a rectangle (e.g., a non-square rectangle). Additional examples of shapes formed by stiffening brace 100 include, without limitation, triangles, pentagons, hexagons, octagons, ovals, diamonds, parallelograms, combinations or variations of one or more of the same, and/or any other suitable shapes.

In addition, stiffening brace 100 may be of any suitable dimensions. In one example, stiffening brace 100 may encompass and/or extend beyond the perimeter of the package of the integrated circuit. In another example, stiffening brace 100 may encompass and/or extend beyond the outer perimeter of the substrate of the integrated circuit. In a further example, stiffening brace 100 may encompass and/or extend beyond the outline of the die(s) included on the integrated circuit.

Stiffening brace 100 may include and/or contain any various materials. Examples of such materials include, without limitation, plastics, ceramics, polymers, metals, composites, combinations or variations of one or more of the same, and/or any other suitable materials.

In some examples, stiffening brace 100 may serve as a foundation and/or base that provides structural support, tension, strength, and/or integrity to the integrated circuit. In one example, stiffening brace 100 may be placed, positioned, secured and/or coupled to the perimeter of the integrated circuit prior to the reflow process in which the bottom surface of the integrated circuit is soldered to a circuit board. After placement, stiffening brace 100 may provide structural support and/or strength to the integrated circuit. By providing structural support to the integrated circuit in this way, stiffening brace 100 may be able to impede and/or prevent the package and/or substrate of the integrated circuit from warping during the reflow process.

As illustrated in FIG. 1, stiffening brace 100 may include a set of borders 102(1), 102(2), 102(3), and 102(4) dimensioned to substantially surround the integrated circuit. In one example, each of borders 102(1)-(4) may include and/or represent an inner portion of material designed and/or intended for placement atop the perimeter of the integrated circuit. In this example, each of borders 102(1)-(4) may also include and/or represent an outer portion of material designed and/or intended to extend beyond the perimeter of the integrated circuit such that the additional portion of material overhangs a circuit board to which the integrated circuit is soldered.

As a specific example, borders 102(1)-(4) may include and/or represent portions of material 106(1), 106(2), 106(3), and 106(4), respectively, which are designed and/or intended for placement atop the perimeter of the integrated circuit. In this example, borders 102(1)-(4) may also include and/or represent additional portions of material 104(1), 104(2), 104(3), and 104(4), respectively, which are designed and/or intended to extend beyond the perimeter of the integrated circuit such that additional portions of material 104(1)-(4) overhang a circuit board to which the integrated circuit is soldered during a reflow process. By extending beyond the perimeter of the integrated circuit in this way, additional portions of material 104(1)-(4) may provide additional structural support and/or strength to stiffening brace 100. As a result of this additional structural support and/or strength, stiffening brace 100 may be able to mitigate and/or prevent warpage of integrated circuits even better during reflow processes.

In some examples, borders 102(1)-(4) may have differing and/or varying lengths relative to one another. For example, borders 102(1) and 102(3) may have the same length as one another, and borders 102(2) and 102(4) may have the same length as one another. However, in this example, the length of borders 102(2) and 102(4) may differ from the length of borders 102(1) and 102(3).

Figure 2:
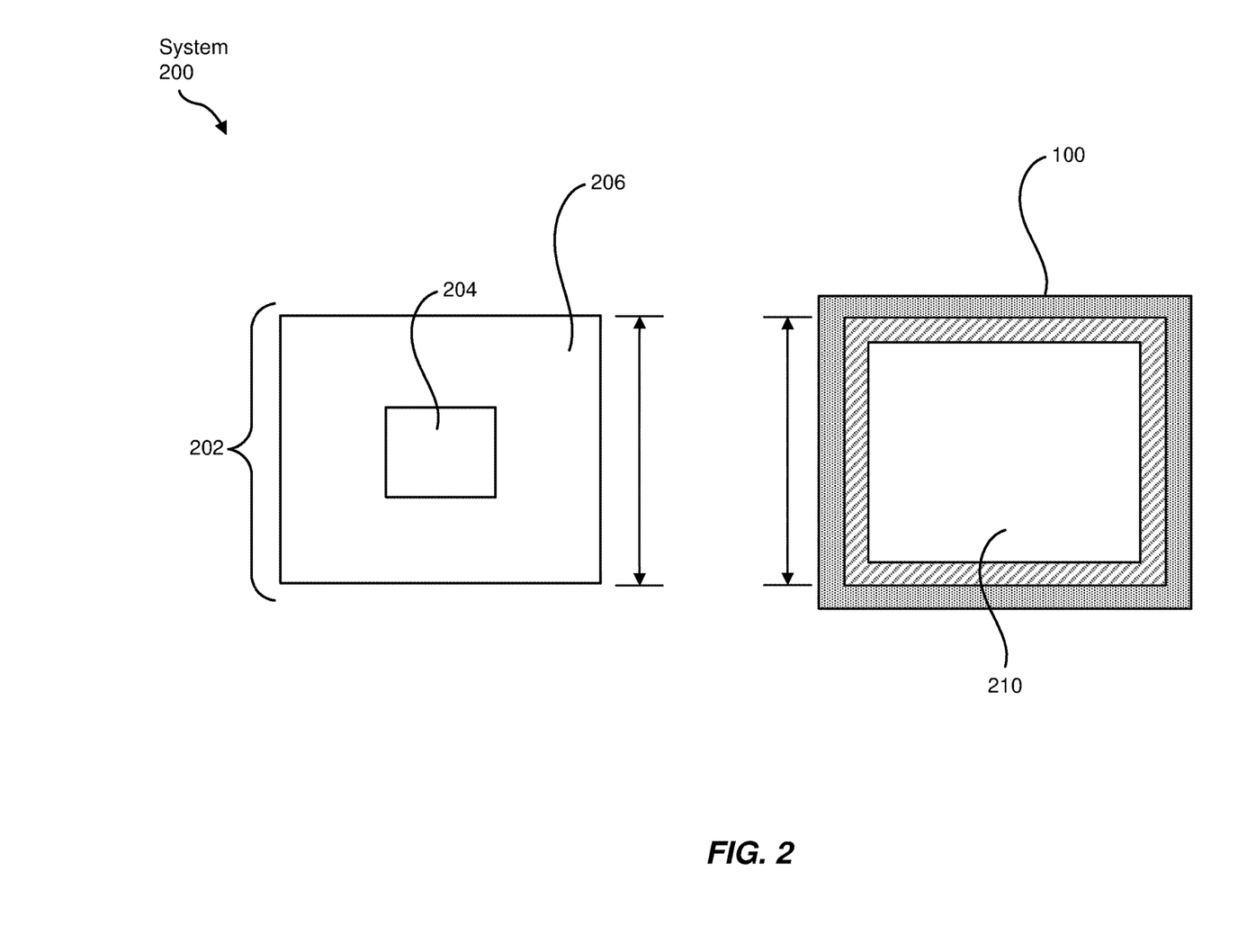
FIG. 2 is a block diagram of an exemplary system for mitigating warpage of integrated circuits during reflow processes.

FIG. 2 shows an exemplary system 200 for mitigating warpage of integrated circuits during reflow processes. As illustrated in FIG. 2, system 200 may include and/or represent an integrated circuit 202 and stiffening brace 100. In some examples, integrated circuit 202 may be lidless. In one example, integrated circuit 202 may be packaged as a surface-mount component. For example, integrated circuit 202 may be packaged as a Ball Grid Array (BGA). Additional examples of such surface-mount component packages include, without limitation, dual-in-line packages, quad-in-line packages, grid array packages, combinations and/or variations of one or more of the same, and/or any other suitable surface-mount component packages.

In one example, integrated circuit 202 may include a substrate 206 and a die 204. In this example, die 204 may be set on and/or attached or coupled to substrate 206.

In one example, substrate 206 may include and/or represent a die of semiconductor materials (such as silicon, germanium, and/or gallium arsenide). In another example, substrate 206 may include and/or represent a die of electrical insulator materials (such as silicon dioxide, sapphire, aluminum oxide, polymers, and/or ceramics). Substrate 206 may include multiple layers of insulation materials. Substrate 206 may also include copper traces and/or through-silicon vias that route the signals from the silicon to the connection terminals and/or leads on the bottom of the package of integrated circuit 202.

In one example, die 204 may include and/or represent a small, diced piece of semiconductor material. For example, die 204 may include and/or represent a silicon wafer. In this example, die 204 may include and/or contain one or more circuits that consist of various electrical and/or electronic components (such as resistors, capacitors, and/or transistors). These circuits may be etched into die 204.

Although illustrated as a single unit in FIG. 2, die 204 may alternatively include and/or represent multiple die attached to substrate 206. In one example, all the multiple die may be located and/or positioned within stiffening brace 100. In another example, the multiple die may be stacked together (using, e.g., a "through-silicon vias" technique) and then attached to substrate 206 as a stack. In a further example, a silicon interposer may be attached to substrate 206 first, after which die 204 and/or other components may be attached to the silicon interposer (in, e.g., a "2.5D" package).

In some examples, integrated circuit 202 may also include stiffening brace 100. For example, stiffening brace 100 may be fastened, attached, and/or coupled to substrate 206. After being attached in this way, stiffening brace 100 may prevent integrated circuit 202 from warping beyond an acceptable degree due to the heat applied during the reflow process. For example, stiffening brace 100 may mitigate warpage of integrated circuit 202 such that all connection terminals and/or leads on integrated circuit 202 are properly soldered to all corresponding contact pads on the circuit board. This mitigation of warpage may ensure that all connection terminals and/or leads on integrated circuit 202 are communicatively coupled to all the corresponding contact pads on the circuit board.

In other words, none of the solder points between the connection terminals and/or leads on integrated circuit 202 and the corresponding contact pads on the circuit board may suffer from imperfections that disturb and/or harm the circuit board's communicative integrity. Such solder point imperfections include, without limitation, non-wet open defects, head-on-pillow defects, bridged solder joints, stretched solder joints, head-on-pillow open defects, combinations and/or variations of one or more of the same, and/or any other solder point imperfections.

In some examples, portions of material 106(1)-(4) may be sized and/or dimensioned such that the outer edges of portions of material 106(1)-(4) align with and/or follow the outer edges of substrate 206. In other words, substrate 206 may be sized and/or dimensioned such that its perimeter matches and/or coincides with inner perimeter of stiffening brace 100. For example, portions of material 106(1)-(4) may collectively form and/or represent an inner perimeter of stiffening brace 100, and portions of material 104(1)-(4) may collectively form and/or represent an outer perimeter of stiffening brace 100. In this example, the outer edge of the inner perimeter of stiffening brace 100 and the perimeter of substrate 206 may have the same size and/or dimensions as one another.

In such examples, the outer perimeter of stiffening brace 100 may extend outward beyond the perimeter of substrate 206. Accordingly, the outer perimeter of stiffening brace 100 may have a larger size and/or larger dimensions than the perimeter of substrate 206. For example, substrate 206 and stiffening brace 100 may both be square shaped. In this example, each side of the inner perimeter of stiffening brace 100 may have a length of 7 centimeters, and each side of the perimeter of substrate 206 may also have a length of 7 centimeters. Continuing with this example, each side of the outer perimeter of stiffening brace 100 may have a length of 9 centimeters.

In some examples, borders 102(1)-(4) of stiffening brace 100 may collectively form and/or represent a single unit and/or a single piece of material. Accordingly, all of portions of material 104(1)-(4) and 106(1)-(4) may collectively form and/or represent a single unit and/or a single piece of material. In such examples, the distinction between the inner perimeter of stiffening brace 100 and the outer perimeter of stiffening brace 100 may be made and/or emphasized herein for the purpose of relativity and/or size or dimensional comparison in connection with substrate 206 of integrated circuit 202.

As illustrated in FIG. 2, borders 102(1)-(4) of stiffening brace 100 may form and/or be assembled or arranged to incorporate a hole 210 into stiffening brace 100. In some examples, hole 210 may enable a heatsink to pass through borders 102(1)-(4) of stiffening brace 100 to make physical contact and/or thermally couple with die 204 of integrated circuit 202.

Figure 3:
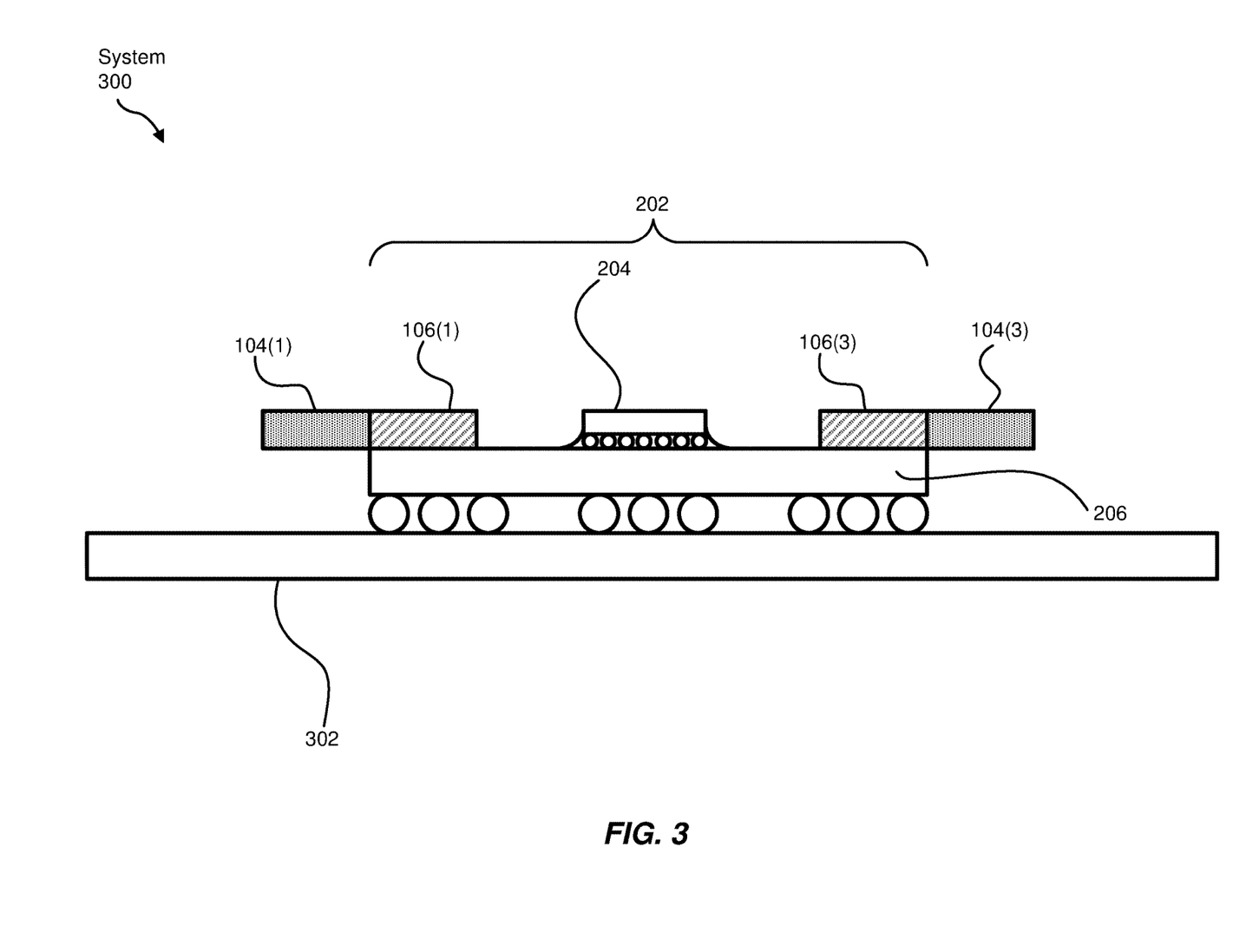
FIG. 3 is a block diagram of an additional exemplary system for mitigating warpage of integrated circuits during reflow processes.
Figure 4:
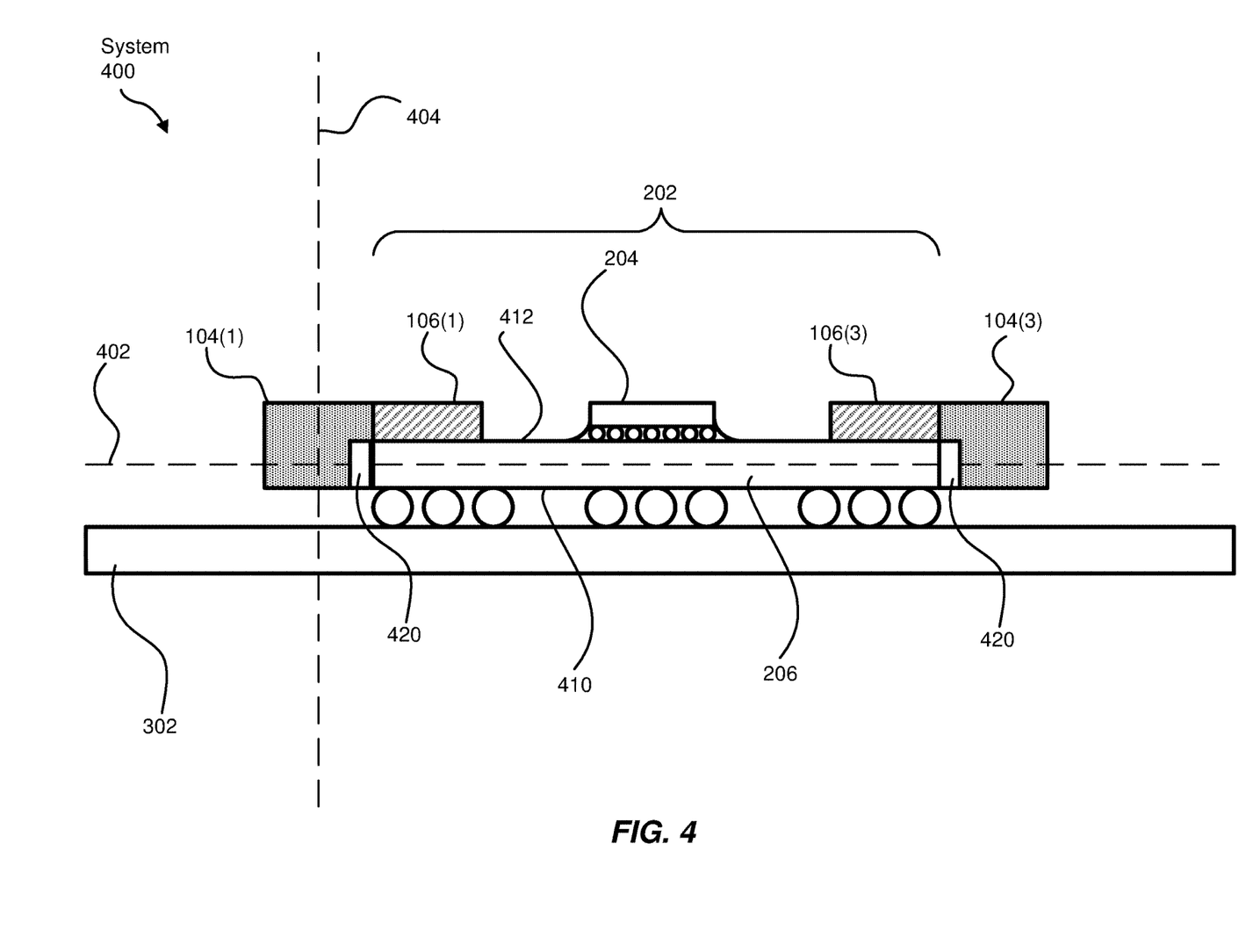
FIG. 4 is a block diagram of an additional exemplary system for mitigating warpage of integrated circuits during reflow processes.
Figure 5:
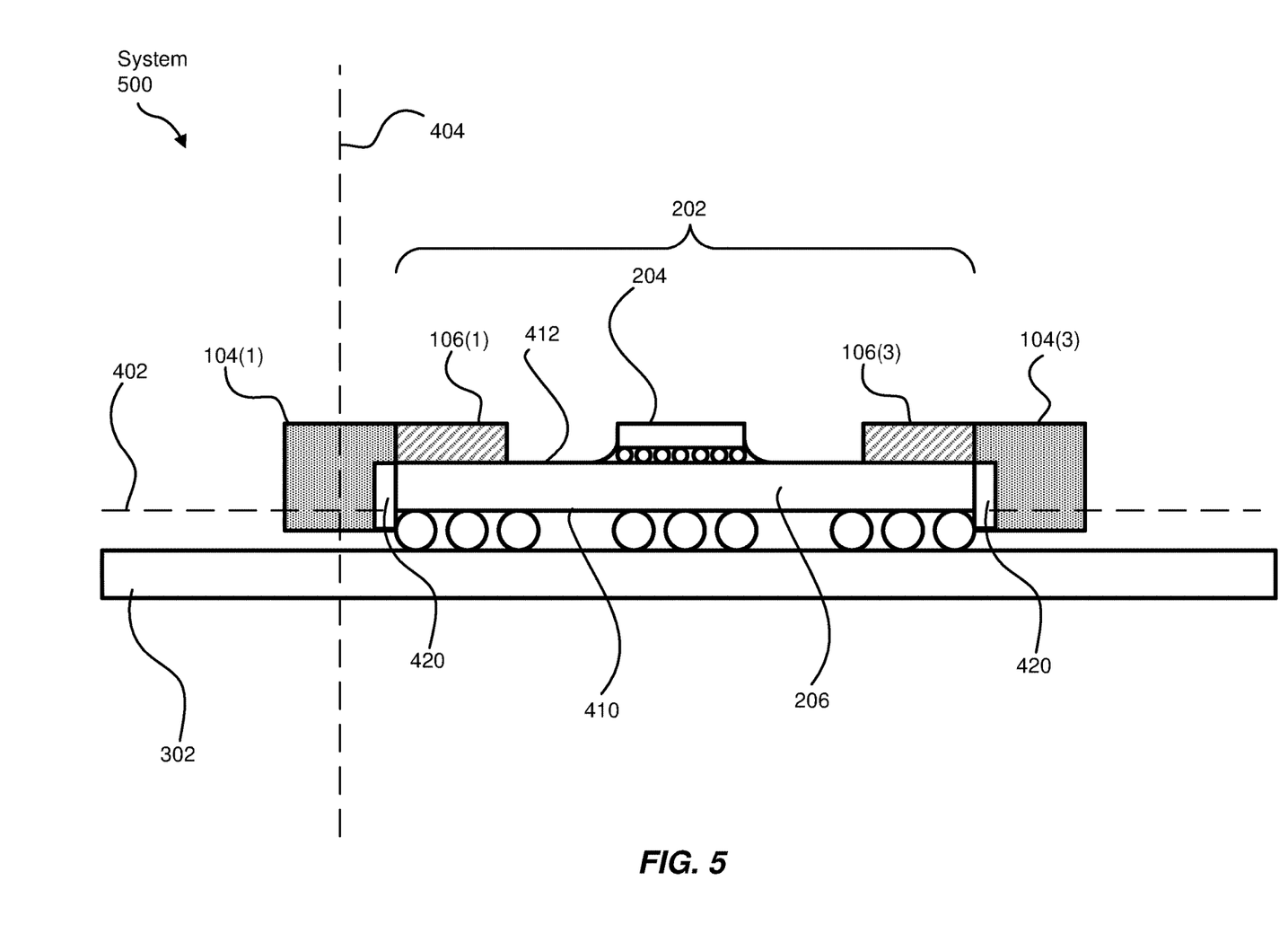
FIG. 5 is a block diagram of an additional exemplary system for mitigating warpage of integrated circuits during reflow processes.

FIGS. 3, 4, and 5 show cross sections of exemplary systems 300, 400, and 500, respectively, for mitigating warpage of integrated circuits during reflow processes. As illustrated in FIGS. 3-5, system 300 may include and/or represent stiffening brace 100 and integrated circuit 202. In these examples, integrated circuit 202 may be secured, coupled, and/or soldered to a circuit board 302. Continuing with this example, stiffening brace 100 may be fastened, attached, coupled, and/or adhered to integrated circuit 202.

As illustrated in FIGS. 3-5, portions of material 106(1)-(4) of stiffening brace 100 may be positioned atop the perimeter of integrated circuit 202. In some examples, portions of material 104(1)-(4) of stiffening brace 100 may extend beyond the perimeter of integrated circuit 202. Accordingly, portions of material 104(1)-(4) may overhang and/or jut over circuit board 302 to which integrated circuit 202 is soldered. In other words, contrary to portions of material 106(1)-(4), portions of material 104(1)-(4) may be suspended over circuit board 302.

As illustrated in FIG. 3, portions of material 104(1)-(4) and 106(1)-(4) of stiffening brace 100 may extend along a horizontal plane. In this example, the bottom edge of portions of material 104(1)-(4) and 106(1)-(4) may be substantially flush and/or aligned with the top surface of substrate 206 of integrated circuit 202. Accordingly, portions of material 104(1)-(4) and 106(1)-(4) may collectively form and/or represent planar surfaces that both interface with substrate 206 and also jut and/or project out over circuit board 302.

In various examples, stiffening brace 100 may be coupled and/or mounted to the top surface of substrate 206 of integrated circuit 202. This coupling may be accomplished in a variety of different ways. For example, stiffening brace 100 may be adhered and/or bonded to substrate 206. Additionally or alternatively, stiffening brace 100 may be placed and/or rested atop substrate 206. Further, stiffening brace 100 may be coupled and/or mounted to substrate 206 by a press-fit fastening, an interference-fit fastening, a friction-fit fastening, and/or a slip-fit fastening.

As illustrated in FIG. 4, portions of material 104(1)-(4) of stiffening brace 100 may extend along a plane 402 beyond the perimeter of substrate 206 of integrated circuit 202. In this example, the bottom edge of portions of material 104(1)-(4) may also extend along a plane 404 such that the bottom edge of portions of material 104(1)-(4) is substantially flush and/or aligned with a bottom surface 410 of substrate 206. Planes 402 and 404 may be substantially perpendicular and/or orthogonal to one another. For example, plane 402 may be horizontal, and plane 404 may be vertical (in at least one orientation of system 400).

As illustrated in FIG. 4, portions of material 106(1)-(4) may interface with a top surface 412 of substrate 206. Additionally or alternatively, bottom surface 410 of substrate 206 may be secured, coupled, and/or soldered to circuit board 302.

As illustrated in FIG. 5, and like system 400 in FIG. 4, portions of material 104(1)-(4) of stiffening brace 100 may extend along plane 402 beyond the perimeter of substrate 206 of integrated circuit 202. However, in this example, the bottom edge of portions of material 104(1)-(4) may also extend along plane 404 such that portions of material 104(1)-(4) exceed bottom surface 410 of substrate 206. Accordingly, while portions of material 104(1)-(4) in FIG. 4 only extend along plane 404 until reaching and/or becoming substantially flush with bottom surface 410 of substrate 206, portions of material 104(1)-(4) in FIG. 5 may extend farther along plane 404 beyond bottom surface 410 of substrate 206. In other words, portions of material 104(1)-(4) in FIG. 5 may extend along plane 404 to the point that they exceed, cross, and/or surpass bottom surface 410 of substrate 206.

In systems 400 and 500 of FIGS. 4 and 5, respectively, stiffening brace 100 may be coupled and/or mounted to substrate 206 in any of the ways described above in connection with FIG. 3. For example, stiffening brace 100 may be adhered and/or bonded to substrate 206 by an adhesive 420. In one example, adhesive 420 may be applied and/or placed on or along one or more sides of substrate 206. Additionally or alternatively, adhesive 420 may be applied and/or placed on or along top surface 412 and/or bottom surface 410 of substrate 206. In these examples, adhesive 420 may reside and/or achieve adhesion between portions of material 104(1)-(4) and substrate 206. Examples of adhesive 420 include, without limitation, glue, cement, mortar, putty, solder, tape, combinations or variations of one or more of the same, and/or any other suitable adhesive.

Figure 6:
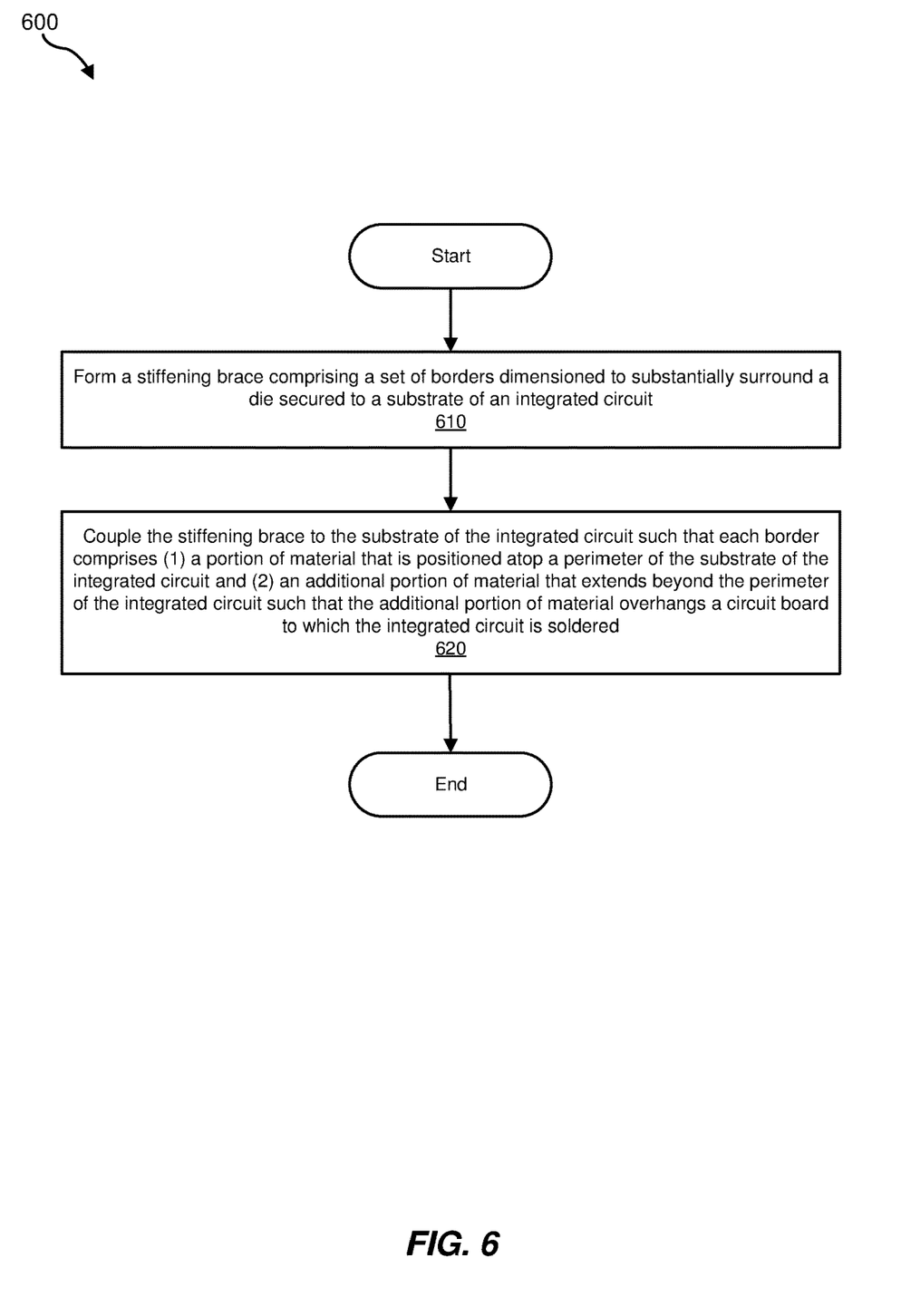
FIG. 6 is a flow diagram of an exemplary method for mitigating warpage of integrated circuits during reflow processes.

FIG. 6 is a flow diagram of an exemplary method 600 for mitigating warpage of integrated circuits during reflow processes. As illustrated in FIG. 6, method 600 may include the step of forming a stiffening brace that includes a set of borders dimensioned to substantially surround a die secured to a substrate of an integrated circuit (610). This forming step may be performed in a variety of ways and/or contexts. For example, an integrated circuit manufacturer and/or a computing equipment manufacturer or vender may piece together and/or assemble a set of borders to form and/or configure a stiffening brace. Additionally or alternatively, the integrated circuit manufacturer and/or a computing equipment manufacturer or vender may cast and/or injection mold a stiffening brace as a single unit that includes a set of borders. Either way, the resulting stiffening brace may be dimensioned to substantially surround one or more die secured to a substrate of an integrated circuit.

As illustrated in FIG. 6, method 600 may also include the step of coupling the stiffening brace to the substrate of the integrated circuit such that each border includes (1) a portion of material that is positioned atop a perimeter of the substrate of the integrated circuit and (2) an additional portion of material that extends beyond the perimeter of the integrated circuit such that the additional portion of material overhangs a circuit board to which the integrated circuit is soldered (620). This coupling step may be performed in a variety of ways and/or contexts. For example, an integrated circuit manufacturer and/or a computing equipment manufacturer or vender may manually or automatically place and/or mount the stiffening brace on the integrated circuit prior to a reflow process. In one example, the integrated circuit manufacturer and/or a computing equipment manufacturer or vender may apply some adhesive material between the stiffening brace and the integrated circuit to adhere and/or bond the stiffening brace to the integrated circuit.

In various examples, the stiffening brace may provide structural support, tension, strength, and/or integrity to the integrated circuit during the reflow process. As a result, the stiffening brace may effectively mitigate warpage and/or impede the integrated circuit from warping during the reflow process. Upon completion of the reflow process, the integrated circuit manufacturer and/or a computing equipment manufacturer or vender may couple and/or apply a heatsink to the integrated circuit through the borders of the stiffening brace, thereby enabling the integrated circuit to achieve the same performance, temperature-control, and/or cooling benefits and/or goals as other lidless integrated circuits.

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A stiffening brace comprising:
    a set of borders dimensioned to substantially surround an integrated circuit, wherein each border comprises:
        a portion of material that is positioned atop a perimeter of the integrated circuit; and an additional portion of material that extends beyond the perimeter of the integrated circuit such that the additional portion of material overhangs a circuit board to which the integrated circuit is soldered, wherein the additional portion of material included in each border of the stiffening brace:
- extends along a first plane beyond the perimeter of the integrated circuit; and
- extends along a second plane that is perpendicular to the first plane such that the additional portion of material included in each border of the stiffening brace:
  - exceeds a bottom surface of a substrate of the integrated circuit along the second plane; and
  - terminates between the bottom surface of the substrate and the circuit board; and an adhesive applied between the additional portion of material that extends along the second plane and at least one side of the substrate of the integrated circuit.

2. The stiffening brace of claim 1, wherein the set of borders collectively provide structural support to the substrate of the integrated circuit to impede the integrated circuit from warping during a reflow process in which the bottom surface of the substrate is soldered to the circuit board.

3. The stiffening brace of claim 1, further comprising the adhesive is further applied between the portion of material positioned atop the perimeter of the integrated circuit and a top surface of the substrate.

4. The stiffening brace of claim 1, further comprising a hole that:
- is formed by the set of borders; and
- enables a heatsink to pass through the set of borders to make physical contact with at least one die of the integrated circuit.

5. The stiffening brace of claim 1, wherein the set of borders comprises:
- a first border with a first set of dimensions; and
- a second border with a second set of dimensions that differ from the first set of dimensions.

6. The stiffening brace of claim 1, wherein the set of borders form a ring that:
- is coupled to the perimeter of the substrate of the integrated circuit; and
- encompasses at least one die of the integrated circuit.

7. The stiffening brace of claim 1, wherein the set of borders form at least one of:
- a non-square rectangle;
- a square; and
- a non-rectangle.

8. A system comprising:
an integrated circuit;
a stiffening brace comprising a set of borders dimensioned to substantially surround the integrated circuit, wherein each border comprises:
- a portion of material that is positioned atop a perimeter of the integrated circuit; and
- an additional portion of material that extends beyond the perimeter of the integrated circuit such that the additional portion of material overhangs a circuit board to which the integrated circuit is soldered, wherein the additional portion of material included in each border of the stiffening brace:
  - extends along a first plane beyond the perimeter of the integrated circuit; and
  - extends along a second plane that is perpendicular to the first plane such that the additional portion of material included in each border of the stiffening brace:
    - exceeds a bottom surface of a substrate of the integrated circuit along the second plane; and
    - terminates between the bottom surface of the substrate and the circuit board; and an adhesive applied between the additional portion of material that extends along the second plane and at least one side of the substrate of the integrated circuit.

9. The system of claim 8, wherein the set of borders collectively provide structural support to the substrate of the integrated circuit to impede the integrated circuit from warping during a reflow process in which the bottom surface of the substrate is soldered to the circuit board.

10. The system of claim 8, further comprising the adhesive applied between the portion of material positioned atop the perimeter of the integrated circuit and a top surface of the substrate.

11. The system of claim 8, wherein the stiffening brace forms a hole with the set of borders and enables a heatsink to pass through the set of borders to make physical contact with at least one die of the integrated circuit.

12. A method comprising:
forming a stiffening brace comprising a set of borders dimensioned to substantially surround a die secured to a substrate of an integrated circuit; and
coupling the stiffening brace to the substrate of the integrated circuit such that each border comprises:
- a portion of material that is positioned atop a perimeter of the substrate of the integrated circuit; and
- an additional portion of material that extends beyond the perimeter of the integrated circuit such that the additional portion of material overhangs a circuit board to which the integrated circuit is soldered, wherein the additional portion of material included in each border of the stiffening brace:
  - extends along a first plane beyond the perimeter of the integrated circuit; and
  - extends along a second plane that is perpendicular to the first plane such that the additional portion of material included in each border of the stiffening brace:
    - exceeds a bottom surface of the substrate of the integrated circuit along the second plane; and
    - terminates between the bottom surface of the substrate and the circuit board; and applying an adhesive between the additional portion of material that extends along the second plane and at least one side of the substrate of the integrated circuit.

* * * * *